(12) United States Patent
Gehrke et al.

(10) Patent No.: US 10,263,613 B2
(45) Date of Patent: Apr. 16, 2019

(54) SAFETY-ORIENTED LOAD SWITCHING DEVICE AND METHOD FOR OPERATING A SAFETY-ORIENTED LOAD SWITCHING DEVICE

(71) Applicant: FESTO AG & Co. KG, Esslingen (DE)

(72) Inventors: Martin Gehrke, Weinstadt (DE); Colin Leitner, Wendlingen (DE); Jorg Quaas, Ostfildern (DE); Sebastian Block, Denkendorf (DE)

(73) Assignee: FESTO AG & CO. KG, Esslingen (DE)

( * ) Notice: Subject to any disclaimer, the term of this patent is extended or adjusted under 35 U.S.C. 154(b) by 415 days.

(21) Appl. No.: 15/070,573

(22) Filed: Mar. 15, 2016

(65) Prior Publication Data

US 2016/0285276 A1      Sep. 29, 2016

(30) Foreign Application Priority Data

Mar. 25, 2015   (DE) .......................... 10 2015 003 925

(51) Int. Cl.
*H02J 4/00*      (2006.01)
*H03K 17/082*    (2006.01)
(Continued)

(52) U.S. Cl.
CPC .......... *H03K 17/082* (2013.01); *H03K 17/18* (2013.01); *H02H 3/14* (2013.01); *H02H 3/16* (2013.01); *H02H 7/222* (2013.01)

(58) Field of Classification Search
CPC .. H03K 17/082; H03K 17/18; H03K 17/0822; H02H 3/14; H02H 3/16;
(Continued)

(56) References Cited

U.S. PATENT DOCUMENTS 3,649,122 A * 3/1972 Holtz ....................... G01C 5/00
                                                           250/208.6
2004/0258165 A1* 12/2004 Peltonen .................. H04B 3/54
                                                            375/257

(Continued)

FOREIGN PATENT DOCUMENTS

DE   102010004524   7/2011
EP       2519960   12/2014
(Continued)

*Primary Examiner* — Thienvu V Tran
*Assistant Examiner* — Brain K Baxter
(74) *Attorney, Agent, or Firm* — Hoffmann & Baron, LLP

(57) ABSTRACT

A safety-oriented load switching device for the electric switching of an automation component, the device including a first branch circuit and a second branch circuit which extend from a respective supply-side supply connection to a respective load-side load connection, wherein a switching assembly including a parallel circuit of a switching means designed for an opening and a closing of the respective branch circuit and of a resistor means is formed in each branch circuit, and further including at least one measuring point located between the switching assembly and the load connection, and wherein a potential measuring device, which is electrically connected to a reference point and configured for providing a potential-dependent measuring signal, is connected to the measuring point.

7 Claims, 3 Drawing Sheets

(51) Int. Cl.
*H03K 17/18* (2006.01)
*H02H 3/14* (2006.01)
*H02H 3/16* (2006.01)
*H02H 7/22* (2006.01)

(58) Field of Classification Search
CPC . H02H 7/222; H02H 11/00; H02J 9/06; H02J 9/061; H05B 39/08
USPC ......................................................... 307/125
See application file for complete search history.

(56) References Cited

U.S. PATENT DOCUMENTS

2014/0246906 A1* 9/2014 Wang ..................... H02J 9/061
307/23
2016/0322184 A1* 11/2016 Schmitz ............... H01H 33/596

FOREIGN PATENT DOCUMENTS

WO     WO 2011085958 A1 * 7/2011 ............. H03K 17/18
WO     WO 2011098282 A1 * 8/2011 ........... H01H 47/004

* cited by examiner

SAFETY-ORIENTED LOAD SWITCHING DEVICE AND METHOD FOR OPERATING A SAFETY-ORIENTED LOAD SWITCHING DEVICE

BACKGROUND OF THE INVENTION

The invention relates to a safety-oriented load switching device for the electric switching of an automation component, the device comprising a first branch circuit and a second branch circuit which extend from a respective supply-side supply connection to a respective load-side load connection, wherein a switching assembly comprising a parallel circuit of a switching means designed for an opening and a closing of the respective branch circuit and of a resistor means is formed in each branch circuit, and further comprising at least one measuring point located between the switching assembly and the load connection. The invention further relates to a method for operating a safety-oriented load switching device.

From EP 2 519 960 B1, a device for electric circuit monitoring of a load circuit containing at least one electric load is known. In this, it is provided that two supply connections are, via current paths having a switch each, connected to two load connections to which the at least one load is connected, wherein control means are provided for opening the two switches in the current paths, and wherein an additional voltage source, the potential of which can be applied to one of the load connections by means of a further switch, is provided, and wherein the control means are also provided for closing the further switch during inspection intervals, signalling means being provided for generating fault signals on the detection of a current flow through the further switch which exceeds a preset or presettable current flow.

SUMMARY OF THE INVENTION

The invention is based on the problem of providing a safety-oriented load switching device and a method for operating a safety-oriented load switching device, wherein a detection of a fault-related electric connection between at least one of the branch circuits and an electric potential, in particular a further supply potential or a ground potential, can be achieved at reduced circuit engineering effort and cost.

According to a first aspect of the invention, this problem is solved for a safety-oriented load switching device by a safety-oriented load switching device for the electric switching of an automation component, the device comprising a first branch circuit and a second branch circuit which extend from a respective supply-side supply connection to a respective load-side load connection, wherein a switching assembly comprising a parallel circuit of a switching means designed for an opening and a closing of the respective branch circuit and of a resistor means is formed in each branch circuit, and further comprising at least one measuring point located between the switching assembly and the load connection, wherein a potential measuring device, which is electrically connected to a reference point and configured for providing a potential-dependent measuring signal, is connected to the measuring point.

From prior art, it is known that, in parallel with a switching means, a series circuit of a voltage source and a measurement resistor is provided and that conclusions regarding the functionality of the switching means to be monitored are drawn from a voltage drop at the measurement resistor.

In the load switching device according to the invention, there is no need for such a voltage source. On the contrary, use is made of the existing supply source, which is provided for the electric supply of the automation component connected to the load connections and which is connected to the supply connections, in order to provide the electric potential(s) required for checking the load switching device within the load switching device itself. This in particular applies to a state in which the two switching means are open and the load to be connected to the supply connections is not supplied with energy. In this case, current flows via the resistor means arranged parallel to the switching means and via the load connected to the load connections, and this current causes a voltage drop at the two resistor means arranged parallel to the switching means, resulting at the measuring point in an electric potential depending on the electric resistances of the resistor means and the load, provided that the load switching device, the load connected thereto and the connecting lines of the load to the load connections function perfectly. If, however, there is an unwanted connection between one of the branch circuits or the load or the load connecting lines and an external electric potential, there is a potential shift at the measuring point, which is detected and results in the output of a fault message if applicable.

The electric resistances of the resistor means are preferably chosen to be considerably higher than the electric resistance of the load. On the one hand, this ensures that, if the switching means are open, the current flow does not lie at a level at which an operation of the load, which may be a drive motor for example, has to be expected. On the other hand, it is ensured that a voltage drop in the circuit represented by the first resistor means in the first branch circuit, the connected load and the second resistor means connected thereto in the second branch circuit occurs almost exclusively at the two resistor means, resulting in a detectable electric potential at the measuring point. In addition, the sensitivity of the measuring device to a fault-related electric connection between at least one of the branch circuits and an electric potential which is independent of the supply source, in particular a further supply potential or a ground potential, is enhanced. This potential is measured by the measuring device against a reference potential applied to a reference point and can then be output by the measuring device.

Whereas there is a presettable potential difference between the measuring point and the reference point if the load switching device functions correctly, a first fault can result in a divergence of the measured potential difference from the preset potential difference. This is, for example, due to the fact that one or both of the switching means, which may be electronically controlled semiconductor switches in particular, malfunction(s). Alternatively, it may be the case that, owing to a damage in the first and/or second branch circuit, there is an unwanted electric contact with another electric potential, such as a supply potential or a ground potential. This, too, will cause a divergence of the difference between the expected potential and the potential measured at the measuring point against the reference potential, which divergence indicates a fault.

The measuring device may, for example, be an analogue or digital voltmeter which indicates the potential difference between the measuring point and the reference point. It is preferably provided that the potential measuring device is connected to an evaluation device configured for detecting the measuring signal within a presettable measuring time interval and for outputting a status signal dependent on the detected measuring signal. The evaluation device can be configured as an analogue circuit, in particular as a comparator circuit, which compares the potential difference detected by the measuring device to a presettable potential difference and, if the two potential differences diverge, outputs a status signal if the divergence exceeds a presettable threshold value. Alternatively, the evaluation device can be a digital circuit or a microcontroller programme which, in particular, first digitises the potentials detected by the measuring device and then compares them to a stored potential value. In this case, too, a status signal dependent on the divergence between the two potential differences is output. In either case, it is provided that the status signal is detected within a presettable time window or measuring signal interval, for example in order to block out switching effects which may occur if the switching means are opened owing to the properties of the load. These switching effects in particular include strong potential fluctuations due to capacitive and inductive components of the load. Accordingly, it can be provided that the potential difference is only evaluated after a presettable period of time has elapsed, followed by the detection of the desired status signal.

The status signal can be made available to a higher-order machine control system and can, for example, include information that the load switching device is working correctly or that the load switching device is faulty as a result of at least one fault-related electric connection between at least one of the branch circuits and an electric potential, in particular a further supply potential or a ground potential. The status signal is preferably made available to the higher-order control system either at regular intervals or on demand. It is particularly advantageous if the status signal is provided in phases in which the switching means of the load switching device are in an open state, because in this case a fault-related electric connection between at least one of the branch circuits and an electric potential, in particular a further supply potential or a ground potential can be detected at lower metrological expenditure.

Advantageous further developments of the invention form the subject matter of the dependent claims.

It is expedient if an equalisation arrangement configured for potential equalisation between the branch circuits is provided on the load side between the first branch circuit and the second branch circuit. By way of example, the potential equalisation arrangement can have the purpose of shortening the time within which switch-off effects have a significant influence on the detection of the potential difference. A shortening of this time is particularly desirable, because the load switching device according to the invention is preferably used for loads which can endanger humans and/or machines and because, if at least one of the switching means malfunctions or if there is another fault-related electric connection between at least one of the branch circuits and an electric potential, in particular a further supply potential or a ground potential, further measures have to be taken as quickly as possible in order to interrupt any further energy supply to the load. Accordingly, the potential equalisation arrangement has to equalise capacitive and/or inductive components of the load as quickly as possible, so that an electric potential depending on the resistive components of the two resistor means is present at the measuring point within as short a time as possible.

It is preferably provided that the equalisation arrangement comprises a resistor arrangement and/or a freewheeling diode. This facilitates an equalisation of capacitive components of the load and/or inductive components of the load by simple means.

In a further development of the invention, it is provided that a voltage divider configured for a supply-side pro vision of a reference potential is located on the supply side between the first branch circuit and the second branch circuit. This reference potential can in particular be used as a reference value for the at least one potential measuring device connected to the measuring point. As a result, the actual supply voltage is not relevant for fault detection by means of the load switching device.

It is preferably provided that the evaluation device comprises a lock-in amplifier which is configured for the synchronised measurement of weak electric signals and which can detect even small divergences between an expected potential difference profile and an actual potential difference profile. This matters in particular if, during the operation of the load, i.e. when the switching means are closed, there is an intention to check, by temporarily opening the switching means, whether there is a fault-related electric connection between at least one of the branch circuits and an electric potential, in particular a further supply potential or a ground potential. In this, the switching means are switched off in such a way that an operation of the load is not compromised, which can in particular be technically facilitated by using semiconductor switches for the switching means. As, however, there would be only minimal changes at the loadside measuring points if the switching means are switched off for such a short time, in particular in the range of a few milliseconds, the additional load-side equalisation arrangement is provided on the one hand. On the other hand, a high sensitivity of the measuring process is made possible by the synchronisation with the momentary switch-off operations for checking purposes as provided by the lock-in amplifier.

It is preferably provided that the equalisation arrangement comprises a series circuit of resistors and a measuring point located between these resistors. The equalisation arrangement and the supply-side voltage divider preferably form a Wheatstone bridge circuit for detecting the load-side influence of external potentials on one of the two branch circuits, using relatively simple measuring technology.

In this context, it is particularly advantageous if the resistances of the resistor means are chosen to be equal in the branch circuits and/or on the resistor arrangement.

It is expedient if an electric resistance of the resistor means is chosen to be high enough with respect to a load intended for connection to the load connections and/or with respect to the equalisation resistor arrangement. This ensures that a current flow across the load cannot result in the unintentional operation of the load while the switching means are open.

It is preferably provided that the reference point is configured for the provision of a reference potential, in particular a ground potential or a supply potential or a measuring point potential. With the aid of the reference potential provided by the reference point, the potential difference against the respective measuring point can be measured as a voltage value, making it possible to determine the potential at the measuring point. The measuring point can optionally have the electric potential of the supply source or of a chassis terminal or of a second measuring point, which may in particular be located at the other branch circuit or on the supply side.

According to a second aspect, the problem of the invention is solved by a method for operating a safety-oriented load switching device for the electric switching of an automation component, the device comprising a first branch circuit and a second branch circuit which extend from a respective supply-side supply connection to a respective load-side load connection, wherein a switching assembly comprising a parallel circuit of a switching means designed for an opening and a closing of the respective branch circuit and of a resistor means is formed in each branch circuit, and further comprising at least one measuring point located between the switching assembly and the load connection wherein a potential measuring device, which is electrically connected to a reference point and configured for providing a potential-dependent measuring signal, is connected to the measuring point, wherein an evaluation device connected to the potential measuring device provides a function signal if a measuring signal of the potential measuring device which is detected prior to an imminent closing of the switching means lies within a tolerance interval about a presettable signal level, and that the evaluation device provides a fault signal if the measuring signal lies outside the tolerance interval about the presettable signal level.

In an alternative variant of the method, it is provided that the evaluation device compares, during the operation of the load at the end of a presettable measuring time interval after the opening of the switching means, an electric potential at the load-side measuring point to an electric potential at the supply-side measuring point, wherein the switching means close after an opening time interval has elapsed and the measuring time interval is shorter than the opening time interval. With this alternative variant of the method, possible fault-related electric connections between at least one of the branch circuits and an electric potential, in particular a further supply potential or a ground potential, are detected while the operation of the load remains virtually uninterrupted. In this, the opening time interval is chosen as a function of the properties of the load in such a way that the interruption of the energy supply to the load, which is caused by the temporary opening of the switching means, does not change the operating conditions for the load to any relevant degree. In order to obtain a measurement as meaningful as possible within the available measuring time, it is accordingly provided that the measuring signals are detected at a point in time immediately preceding a closing of the switching means in order to be able to use as great an impact as possible of any fault-related electric connections between at least one of the branch circuits and an electric potential, in particular a further supply potential or a ground potential, on the measuring signals as a basis for the further processing of the measuring signals. The opening time interval is preferably considerably shorter than 1 millisecond.

BRIEF DESCRIPTION OF THE DRAWINGS

Advantageous embodiments of the invention are illustrated in the drawing, of which.

DETAILED DESCRIPTION

Figure 1:
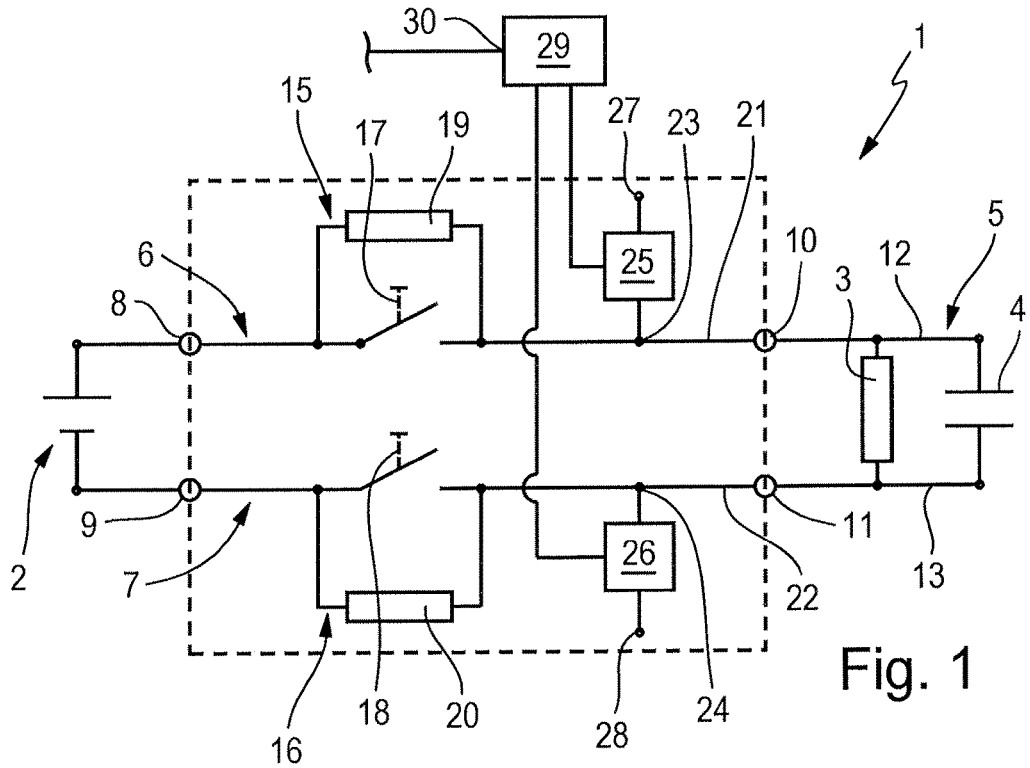
FIG. 1 shows a first embodiment of a safety-oriented load switching device with a connected supply source and a connected load in an open state of the switching means.

A first embodiment of a safety-oriented load switching device 1 as shown in FIG. 1 is intended for positioning between a supply source shown as a voltage source 2 by way of example and an electric load 5 shown as a parallel circuit of a load resistor 3 and a load capacitor 4 by way of example, the load 5 having two supply lines 12, 13 for an electric coupling to the load switching device 1.

The load switching device comprises a first branch circuit 6 and a second branch circuit 7 arranged parallel thereto. Each of the branch circuits 6, 7 extends from a supply connection 8, 9 to a load connection 10, 11. In each of the branch circuits 6, 7, a switching arrangement is provided, which is a parallel circuit of a switching means 17, 18 and a resistor means 19, 20 in the illustrated embodiment. The switching means 17, 18 are preferably represented by semiconductor switches, in particular field effect transistors, and can be switched individually between an open position and a closed position by a control device not shown in the drawing by way of an electric control signal. In the open position, there is only an electric connection between the supply connection 8, 9 and the load connection 10, 11 via the respective resistor means 19, 20. In the closed position, a current flows between the supply connection 8, 9 and the respectively associated load connection 10, 11 in parallel via the switching means 17, 18 and the resistor means 19, 20.

The purpose of the load switching device 1 is the detection of a fault-related electric connection between at least one of the branch circuits 6, 7 or the supply lines 12, 13 and an electric potential, in particular a further supply potential or a ground potential. Such a fault-related electric connection may, for example, be caused by a damaged switching means 17, 18 or a load-side short circuit to earth or to supply. A switching means 17 or 18 configured as a semiconductor switch may, for example, suffer damage to its semiconductor structure as a result of production faults or a temporary electric overload, with the result that the respective branch circuit 6, 7 is not opened completely although the switching means 17 or 18 has been selected accordingly, so that a current exceeding the value intended for a safe disconnection of the load flows in the branch circuits 6, 7. Alternatively, there may be an electric connection between a load-side branch circuit section 21 or 22 of the respective branch circuit 6 or 7, which is formed between the respective switching means 17 or 18 and the respective load connection 10 or 11, and an additional electric potential, for example another supply potential or a ground potential, for example as a result of damage to the electric lines forming the respective branch circuits 6, 7.

On each load-side branch circuit section 21, 22, a measuring point 23, 24 is formed, to which a potential measuring device 25, 26 is connected. Each potential measuring device 25, 26 is configured for detecting a potential difference between the associated measuring point 23, 24 and a reference point 27, 28, to which an electric reference potential, in particular a ground potential, is applied. Each potential measuring device 25, 26 is configured for providing a measuring signal to an evaluation device 29, which is in turn configured for processing the measuring signals and for outputting a status signal at a signal interface 30. In the illustrated embodiment, it is provided that the signal interface 30 is connected via a bus line to a higher-order control system not shown in the drawing, in particular a programmable logic controller (PLC). The higher-order control system may also be provided for controlling the switching means 17, 18 in order to operate the load 5 in accordance with a preset operating sequence.

If the load switching device 1 is operated as shown in FIG. 1, i.e. with the switching means 17, 18 open, current can only flow between the supply connection 8 and the supply connection 9 via the resistor means 19, the load resistor 3 and the resistor means 20, provided there is no electric fault. It is preferable provided that each of the resistor means 19, 20 has an electric resistance which is considerably higher than that of the load resistor 3. Accordingly, the electric potential at the measuring points 23 and 24 depends at least almost exclusively on the resistance values of the resistor means 19, 20. In the illustrated embodiment, it is provided that the electric resistances of the resistor means 19, 20 are identical, so that the electric potentials at the measuring points 23 and 24 correspond at least almost to half the supply voltage made available at the supply connections 8, 9. If the electric potentials at the measuring points 23 and 24 are largely identical, in particular within a presettable tolerance range, and if the corresponding measuring signals of the respective potential measuring device 25, 26, which are compared to preset signal levels in the evaluation device 29, agree, the evaluation device 29 can provide a function signal indicating the correct function of the load switching device 1 at the signal interface 30.

If, on the other hand, there is an unwanted electric contact between one of the load-side branch circuit sections 21, 22 or one of the connecting lines 12, 13 and an electric potential, there will be divergent electric potentials at the measuring points 23, 24 if the switching means 17, 18 are open; these result in different measuring signals of the potential measuring device 25, 26 and can be detected in the evaluation device 29. If such divergences of the measuring signals of the potential measuring device 25, 26 lie outside a presettable tolerance interval, the evaluation device 29 is configured for outputting a fault signal.

The load switching device 1 shown in FIG. 1 is provided for use with a load 5 which is non-energised before each switching-on process and which can cause a hazard when the energy supply is switched on. In order to ensure a defined safety level, is has to be ensured, before the load 5 is switched on, that it can be switched off again at this point in time and, with a certain probability, at a later point in time. As soon as the load 5 is switched off, the hazard it presents in the switched-on state disappears.

The second embodiment of a load switching device 31 shown in FIG. 2 only differs from the embodiment shown in FIG. 1 by equalisation arrangements in the form of a resistor 32 described in greater detail below and a free-wheeling diode. 33. Apart from that, the load switching device 31 uses the same components as the load switching device 1, so that the same reference numbers are used as for the load switching device 1 and these components are not described again.

The equalisation arrangements 32, 33 have the purpose of effecting, after an operation of the load 5 and an opening of the switching means 17, 18, a fast discharge of the load capacitor 4 or a fast decay of an induced voltage which may be caused by an inductive component of the load 5 which is not shown in the drawing. The equalisation arrangements 32, 33 can be provided either in addition to or as an alternative to one another.

Figure 3:
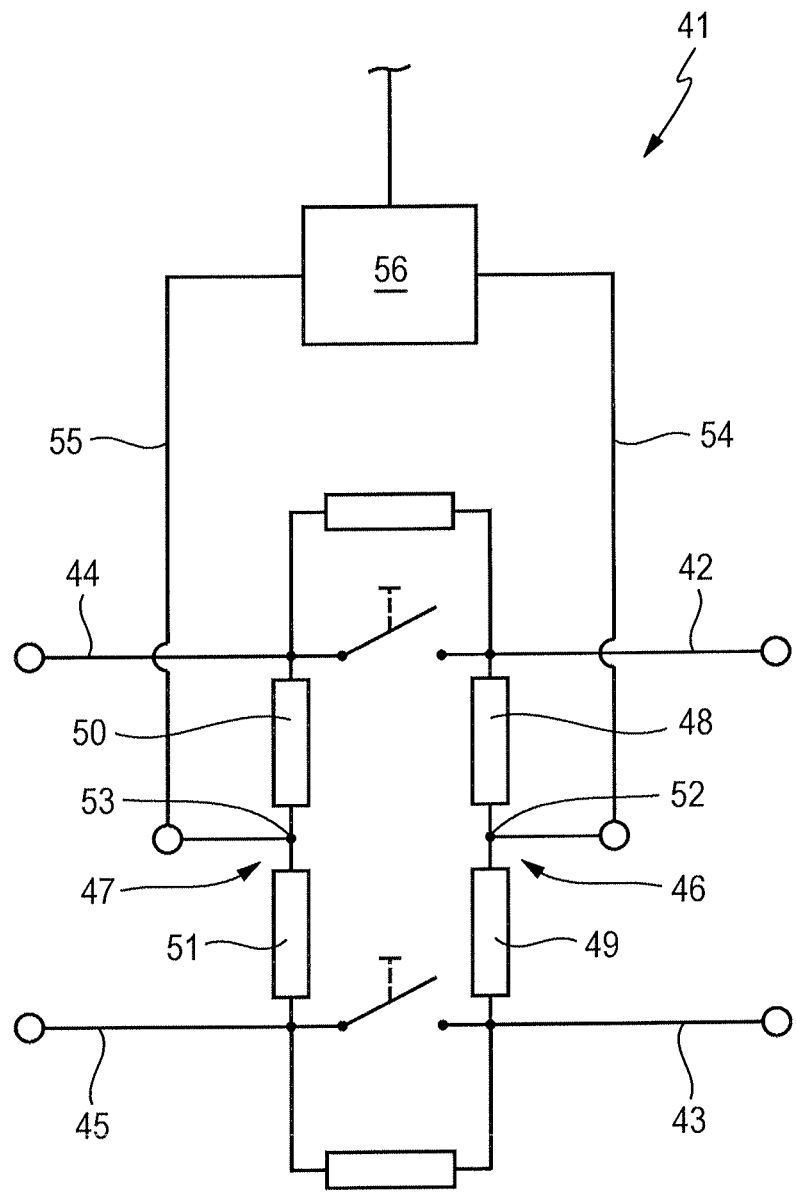
FIG. 3 shows a third embodiment of a safety-oriented load switching device, which is optimised for the detection of a fault-related electric connection between at least one of the branch circuits and an electric potential, in particular a further supply potential or a ground potential, during an operation of the load.

The third embodiment of a load switching device 41 as shown in FIG. 3 is, like the load switching device 1, 31, designed for positioning between a supply source not shown in the drawing and a load likewise not shown in the drawing and accordingly comprises supply connections 8, 9 and load connections 10, 11. The load switching device 41 further comprises, like the load switching devices 1, 31, the switching assemblies 15, 16 with the associated switching means 17, 18 and the resistor means 19, 20.

In contrast to the load switching devices 1, 31 described in greater detail above, the load switching device 41 is provided with equalisation arrangements 46, 47 between the load-side branch circuit sections 42, 43 and the supply-side branch circuit sections 44, 45. In the illustrated embodiment, these equalisation arrangements are represented by series circuits of two resistor means 48, 49 and 50, 51 respectively, with a measuring point 52 and 53 respectively provided between the resistor means 48, 49 and 50, 51 respectively. In the illustrated embodiment, it is provided that the two measuring points 52 and 53 are connected via measuring lines 54, 55 to an evaluation device 56 for the detection of a potential difference between the two measuring points 52 and 53 and for the provision of a status signal as a function of the detected potential difference.

For use in connection with a test-related switch-off of an otherwise connected load 5, the evaluation device 45 is preferably provided with a lock-in amplifier which synchronises the measuring process with the process of the test-related switch-off.

The resistor means 48 to 51 form a Wheatstone bridge circuit which facilitates a particularly sensitive check for perfect function irrespective of the actual value of the supply voltage. This facilitates a testing of the load switching device 41 for proper function, in particular for the presence of faulty switching means 17 or 18 or of other faulty electric connections, even while the load 5 is operated.

For this purpose, it is provided that the two switching means 17, 18 are opened briefly during the operation of the load 5, this opening falling within a presettable time interval which is preferably shorter than 10 ms.

The potential difference is preferably determined by the evaluation device 56 shortly before the end of the opening time interval, because at this time the difference between the electric potentials at the measuring points 52, 53 has the highest possible value. In order to be able to output a reliable status signal, it can be provided that the evaluation device 56 only provides a status signal if several potential differences detected successively are outside a preset measuring interval in the same way. Accordingly, the status signal can only be made available if the load 5 has been briefly switched off several times with the aid of the switching assemblies 15, 16.

Figure 2:
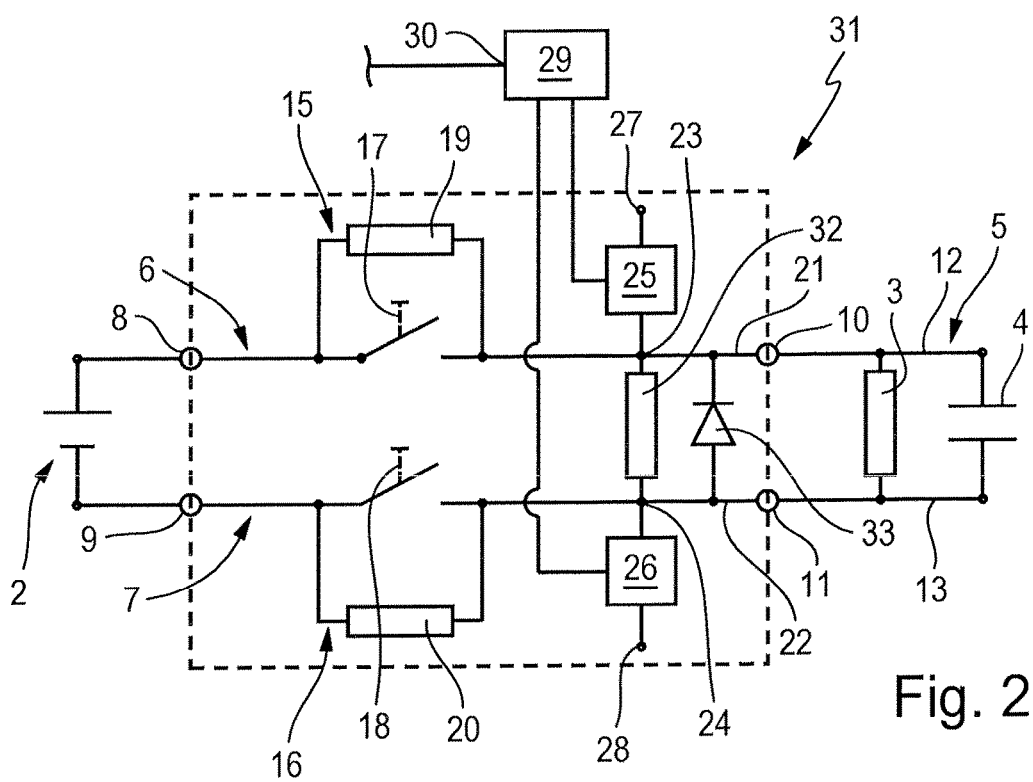
FIG. 2 shows a second embodiment of a safety-oriented load switching device as a variant of the load switching device according to claim 1.

The signal chart shown in FIG. 4 for the embodiment of the load switching device 31 shown in FIG. 2 is, in order to simplify the illustration, divided into four signal chart blocks arranged on top of one another; these will be explained in greater detail below. Purely by way of example, the signal levels experienced in the course of the test are arranged in a time grid with identical time periods; this, however, does not have to correspond to actual conditions but has been provided for a simplified illustration only.

In the bottom signal chart block 60, the control signals 61 for the two switching means 17, 18, which are designed as semiconductor switches and electrically controllable in the illustrated embodiment, are shown. Purely by way of example, the two switching means 17, 18 are controlled by a square wave signal, the signal level of which is switched between a lower value which does not result in a switching function of the respective switching means 17, 18 and a higher value which results in a switching function of the respective switching means 17, 18. The two control signals 61, 62 for the load switching devices 1, 31, 41 according to FIGS. 1 to 3 are provided by a control device not shown in the drawing.

Figure 4:
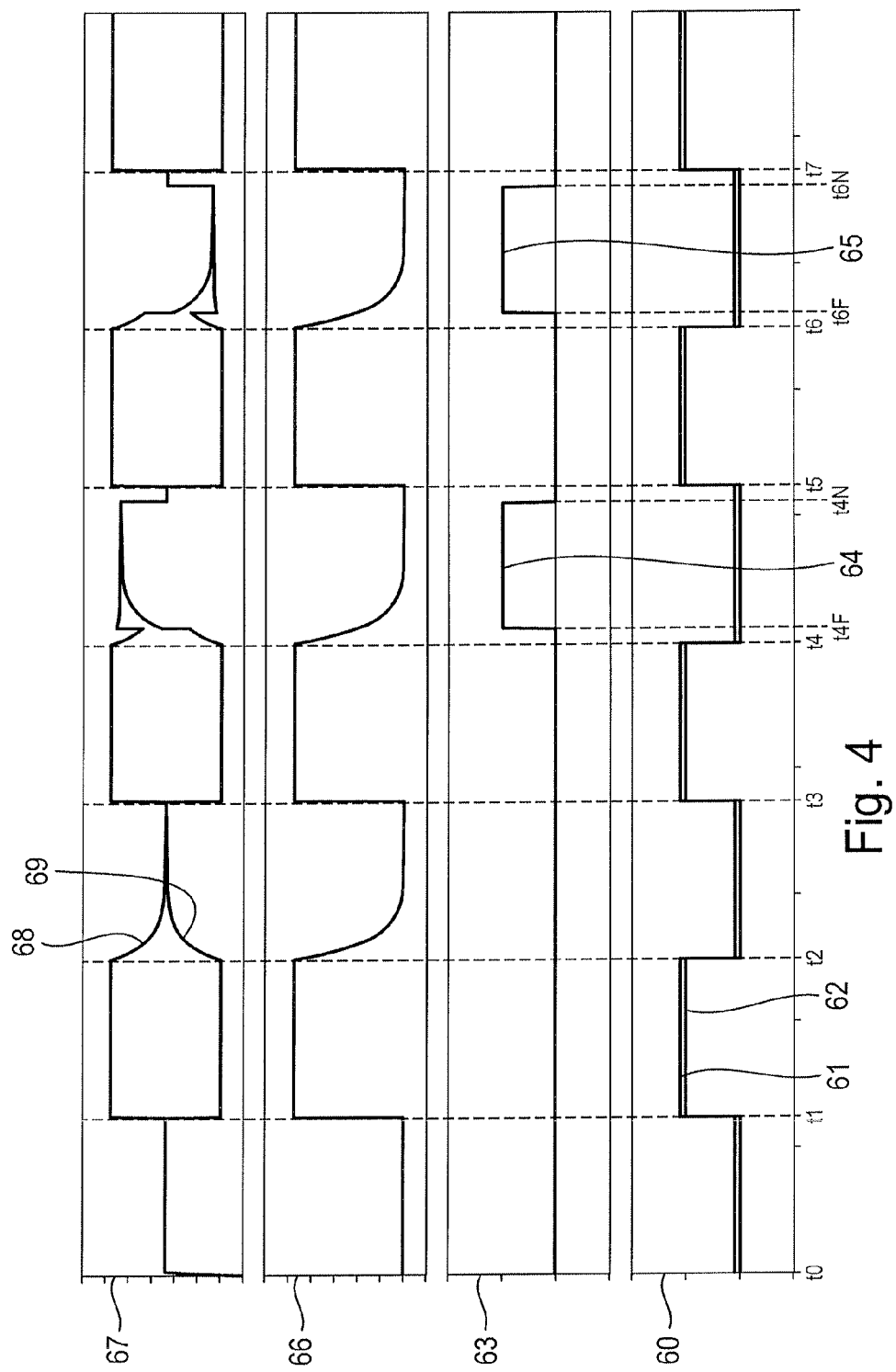
FIG. 4 shows a signal chart for the second embodiment of the safety-oriented load switching device shown in FIG. 2.

In the signal chart block 63 located above the signal chart block 60 in FIG. 4, fault signals 64, 65 are shown to indicate a malfunction of the switching means 17, 18. In the illustrated embodiment, the fault signal 64 is provided to simulate a fault of the switching means 17 which happens during a period of time in which the control signal 61 adopts a low value and there is no activation of the associated switching means 17. Accordingly, the fault signal 64 leads to an unwanted bridging of the switching means 17 and thus to a fault to be detected with the aid of the load switching device 1. The same applies to the fault signal 65, which simulates a fault in the switching means 18.

In the signal chart block 66 placed above, the voltage of the load 5 is entered; purely by way of example, this is increased from a lower voltage level to a higher voltage level on activation of the two switching means 17, 18. This is based on the assumption that the full voltage is applied to the load 5 immediately after the activation of the two switching means 17, 18. In contrast, if the two switching means 17, 18 are switched off, the electric voltage applied to the load 5 is reduced in a time-dependent way owing to the load capacitor 4. The time between the switching-off of the two switching means 17, 18 and the approach of the voltage at the load 5 towards the voltage level depends in particular on the capacitance of the load capacitor 4, the load resistor 3 and the electric resistance of the equalisation arrangement 32.

In the signal chart block 67 placed above, the signal levels 68, 69 of the potential measuring devices 25, 26 are entered, in the present case on the basis of the assumption that the resistor means 19, 20 have the same electric resistance. Accordingly, the load switching device 31 acts as a voltage divider if the switching means 17, 18 are open, i.e. deactivated, and not faulty, in the present case on the basis that the electric resistances of the two resistor means 19, 20 are significantly higher than the electric resistance of the load resistor 3. Accordingly, a drop in the supply voltage made available by the voltage source 2 happens almost exclusively at the two resistor means 19, 20. Under the further assumption that the same reference potential, in particular a ground potential, is applied to the two reference points 27, 28, the signal levels 68, 69 ensue. In a first period of time between t0 and t1, the two control signals 61, 62 have a low value, so that the associated switching means 17, 18 in the load switching device 31, if functioning correctly, have a high resistance and are virtually non-conductive. As a result, there is an at least almost identical electric potential at the measuring point 23, 24, the only difference being the negligible voltage drop at the load resistor 3, which has a low resistance compared to the other resistors.

If the two switching means 17, 18 are activated at the point in time t1 by the corresponding control signals 61, 62, which have a high level from this point in time, the associated switching means 17, 18 in the load switching device 31, if functioning properly, have a low resistance and are virtually conductive, so that there is no significant voltage drop between the supply voltage connection 8 and the measuring point 23, and the electric potential at the measuring point 23 is at least almost equal to the electric potential of the supply source 2. In this functional state of the load switching device 31, the voltage drops almost exclusively at the load resistor 3, so that the ground potential of the supply source 2 is at least almost applied to the measuring point 24. The signal levels 68, 69 adopt a value accordingly between t1 and t2.

At the point in time t2, the switching means 17, 18 are switched off, because the signal levels of the control signals 61, 62 once again adopt the lower value at this time. Owing to the electric charge stored in the load capacitor 4, the potential difference between the two electric potentials at the measuring points 23, 24 is at least partially maintained after the point in time t2 when the two switching means 17, 18 are switched off, followed by a gradual reduction based on the discharge of the load capacitor 4, so that the same electric potential is applied to the two measuring points 23, 24 after a period of time not specified in detail. The duration of the discharge of the load capacitor 4 is determined by the capacitance value of the capacitor 4 and by the electric resistance of the parallel circuit represented by the load resistor 3 and the equalisation arrangement 32; this may be a purely ohmic resistance in particular. In the illustrated embodiment, it is provided that the resistance of the equalisation arrangement 32 at least almost corresponds to the resistance of the resistor means 19 or 20.

On a further activation of the switching means 17, 18 at t3, following shortly after the subsequent deactivation of the switching means 17, 18 at t4, there is at t4F a disturbance of the switching means 17; this is symbolised by the fault signal 64 in the signal chart block 63 and simulates a malfunction of the switching means 17. This malfunction of the switching means 17 may, for example, be a so-called "fused junction" of the switching means 17, which is a semiconductor switch in the illustrated embodiment; in this condition, a barrier junction within the switching means 17 can no longer maintain its barrier function because of overload or ageing, and a current can flow through the switching means 17 even without an external control signal 61. The resulting loss of functionality of the switching means 17 leads to a voltage jump towards the supply potential both at the measuring point 23 and at the measuring point 24 immediately after the occurrence of the fault signal 64. This voltage jump is due to the fact that almost the full supply voltage is applied to the measuring point 23 from the point in time t4F because of the assumed malfunction of the switching means 17. In this situation, a voltage drop occurs only at the parallel circuit of the equalisation arrangement 32 and the load resistor 3 as well as in the resistor means 20 connected in series thereto. As the resistor 20 has a particularly high resistance, virtually the entire voltage drops there, and the electric potentials at the measuring points 23, 24 converge after some time and differ from the supply voltage level at the supply connection 8 only by the voltage drop at the parallel circuit of the equalisation arrangement 32 and the load resistor 3. This shift in the two electric potentials at the measuring points 23, 24 can be detected by the evaluation device 29 of the load switching device 31 and leads to the output of a fault signal at the signal interface 30. In practice, such a fault signal leads to further measures to be taken by the higher-order control system, for example to a disconnection of the power supply for the respective load switching device 31.

At the point in time t4N, the simulation of a fault of the switching means 17 is ended, resulting in the reestablishment of the regular electric potential at the measuring points 23, 24, which has occurred at the end of the period between t2 and t3.

After a regular switch-on phase between t5 and t6, a malfunction of the switching means 18 as indicated by the fault signal 65 is simulated at the point in time t6F. In this case, an unintended short-circuit to earth of the load-side branch circuit section 22 is simulated, so that the signal levels 68 and 69 are pulled towards ground potential and differ only slightly from the ground potential at the supply connection 8 owing to the voltage drop at the parallel circuit of the load resistor 3 and the equalisation arrangement 32. These changes of the signal levels 68, 69 can likewise be detected by the evaluation device 29 and likewise result in the output of a fault signal at the signal interface 30.

At the point in time t6F, the simulation of the malfunction of the switching means 18 is finished, and the regular situation for the two signal levels 68, 69 is re-established.

The invention claimed is:

1. A safety-oriented load switching device for the electric switching of an electric load, the safety-oriented switching device comprising a first branch circuit and a second branch circuit which extend from a respective supply-side supply connection to a respective load-side load connection, wherein a switching assembly comprising a parallel circuit of a semiconductor switch designed for an opening and a closing of the first and second respective branch circuit and of an electric resistance significantly higher than an electric resistance of the electric load is formed in each branch circuit, and further comprising at least one measuring point located between the switching assembly and the respective load-side load connection, and wherein a potential measuring device, which is electrically connected to a reference point and configured for providing a potential-dependent measuring signal, is connected to the at least one measuring point, and wherein an equalisation arrangement configured for potential equalisation between the first and second branch circuits is provided on a load side between the first branch circuit and the second branch circuit, and wherein a voltage divider configured for a supply-side provision of a reference potential is located on a supply side between the first branch circuit and the second branch circuit.

2. The safety-oriented load switching device according to claim 1, wherein the potential measuring device is connected to an evaluation device configured for detecting the potential-dependent measuring signal within a presettable measuring time interval and for outputting a status signal dependent on the detected potential-dependent measuring signal.

3. The safety-oriented load switching device according to claim 1, wherein the equalisation arrangement comprises a resistor arrangement and/or a freewheeling diode.

4. The safety-oriented load switching device according to claim 1, wherein the equalisation arrangement comprises a series circuit of resistors and a measuring point located between the series circuit of resistors.

5. The safety-oriented load switching device according to claim 1, wherein an electric resistance of the electrical resistances significantly higher than an electric resistance of the electric load is chosen such that the electric load is switched off in an open state of the semiconductor switch.

6. The safety-oriented load switching device according to claim 1, wherein the reference point is configured for a provision of a ground potential or a supply potential or a measuring point potential.

7. A method for operating a safety-oriented load switching module, which is configured for an electric switching of an electric load, the safety-oriented load switching module comprising a first branch circuit and a second branch circuit which extend from a respective supply-side supply connection to a respective load-side connection, wherein a switching assembly comprising a parallel circuit of a semiconductor switch designed for an opening and a closing of the first and second respective branch circuit and of an electric resistance significantly higher than an electric resistance of the electric load is formed in each branch circuit, and further comprising at least one measuring point located between the switching assembly and the respective load-side connection, and wherein a potential measuring device, which is electrically connected to a reference point and configured for providing a potential-dependent measuring signal, is connected to the at least one measuring point, and wherein an equalisation arrangement configured for potential equalisation between the first and second branch circuits is provided on the load side between the first branch circuit and the second branch circuit, and wherein a voltage divider configured for a supply-side provision of a reference potential is located on the supply side between the first branch circuit and the second branch circuit, wherein an evaluation device compares, during an operation of an electric load at the end of a presettable measuring time interval after an opening of the semiconductor switch, an electric potential at a load-side measuring point to an electric potential at a supply-side measuring point, wherein the semiconductor switch closes after an opening time interval has elapsed and the presettable measuring time interval is shorter than the opening time interval.

* * * * *